US010957792B2

(12) United States Patent
Nguyen et al.

(10) Patent No.: US 10,957,792 B2
(45) Date of Patent: Mar. 23, 2021

(54) SEMICONDUCTOR DEVICE WITH LATCHUP IMMUNITY

(71) Applicant: Infineon Technologies AG, Neubiberg (DE)

(72) Inventors: Chi Dong Nguyen, Munich (DE); Andreas Rupp, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 11 days.

(21) Appl. No.: 16/103,160

(22) Filed: Aug. 14, 2018

(65) Prior Publication Data

US 2020/0058787 A1 Feb. 20, 2020

(51) Int. Cl.
*H01L 29/78* (2006.01)
*H01L 21/225* (2006.01)
(Continued)

(52) U.S. Cl.
CPC ...... *H01L 29/7817* (2013.01); *H01L 21/2253* (2013.01); *H01L 21/266* (2013.01);
(Continued)

(58) Field of Classification Search
CPC .............. H01L 29/402; H01L 29/7831; H01L 29/7835; H01L 29/7817; H01L 29/0865;
(Continued)

(56) References Cited

U.S. PATENT DOCUMENTS 5,701,023 A * 12/1997 Bulucea .............. H01L 29/7808
257/341
2005/0067655 A1 * 3/2005 Shibib ................... H01L 29/402
257/344

(Continued)

FOREIGN PATENT DOCUMENTS

WO 2012106833 A1 8/2012

OTHER PUBLICATIONS

Chen, Wen-Yi, et al., "Source-Side Engineering to Increase Holding Voltage of LDMOS in a O.5-m 16-V BCD Technology to Avoid Latch-up Failure", 16th IEEE International Symposium on the Physical and Failure Analysis of Integrated Circuits, Jul. 6-10, 2009, 1-4.

*Primary Examiner* — Mohammed Shamsuzzaman
(74) *Attorney, Agent, or Firm* — Murphy, Bilak & Homiller, PLLC (57) ABSTRACT

A semiconductor device includes a body region of a second conductivity type, a body contact region of the second conductivity type formed in the body region and having a higher average doping concentration than the body region, a source region of a first conductivity type opposite the second conductivity type formed in the body region adjacent the body contact region, a drift zone of the first conductivity type spaced apart from the source region by a section of the body region which forms a channel region of the semiconductor device, and a gate electrode configured to control the channel region. The body contact region extends under a majority of the source region in a direction towards the channel region and has a doping concentration of at least 1e18 cm$^{-3}$ under the majority of the source region. Additional semiconductor device embodiments and methods of manufacture are described.

13 Claims, 6 Drawing Sheets

(51) Int. Cl.
  *H01L 21/265* (2006.01)
  *H01L 21/266* (2006.01)
  *H01L 29/08* (2006.01)
  *H01L 29/10* (2006.01)
  *H01L 29/66* (2006.01)

(52) U.S. Cl.
  CPC .... *H01L 21/26513* (2013.01); *H01L 29/0865* (2013.01); *H01L 29/0869* (2013.01); *H01L 29/1087* (2013.01); *H01L 29/1095* (2013.01); *H01L 29/66681* (2013.01)

(58) Field of Classification Search
  CPC ............ H01L 29/0869; H01L 29/1087; H01L 29/1095; H01L 29/66681; H01L 21/2253; H01L 21/26513
  See application file for complete search history.

(56) References Cited

U.S. PATENT DOCUMENTS

| | | | |
|---|---|---|---|
| 2006/0113601 A1* | 6/2006 | Shibib | H01L 29/402 257/365 |
| 2009/0294849 A1* | 12/2009 | Min | H01L 29/7816 257/337 |
| 2011/0156137 A1* | 6/2011 | Ikura | H01L 29/1095 257/330 |
| 2014/0284716 A1 | 9/2014 | Ren et al. | |
| 2016/0359016 A1* | 12/2016 | Imthurn | H01L 29/402 |
| 2017/0372985 A1* | 12/2017 | Birner | H01L 21/76898 |
| 2017/0373187 A1* | 12/2017 | Birner | H01L 21/76804 |
| 2019/0378925 A1* | 12/2019 | Shinohara | H01L 21/76237 |

\* cited by examiner

SEMICONDUCTOR DEVICE WITH LATCHUP IMMUNITY

BACKGROUND

Low holding voltage in lateral DMOS (Double-Diffused MOS) devices leads to latch-up failure in high voltage integrated circuits. If the holding voltage of a parasitic bipolar device is below the supply voltage for a circuit that includes the parasitic bipolar device, the latchup condition will persist until the circuit is destroyed. A device configuration with high holding voltage offers advantages in both latch-up immunity and ESD (electrostatic discharge) robustness. However, conventional approaches for providing high holding voltage DMOS devices typically involve stacking separate chips (dies) or other external devices in a configuration which can effectively increase the holding voltage. This technique requires a complex chip stacking arrangement which is costly. Another conventional approach involves increasing the breakdown/trigger voltage of the parasitic bipolar device to a value much higher than usually necessary to avoid triggering altogether, e.g., by increasing one or more chip dimensions such as channel length. Such approaches consume significant additional area, and may adversely affect device performance, e.g., by increasing the on-state resistance of the device in the case of increasing channel length.

Hence, there is a need for a more cost-effective and robust latchup immunity solution for semiconductor devices.

SUMMARY

According to an embodiment of a semiconductor device, the semiconductor device comprises: a body region of a second conductivity type; a body contact region of the second conductivity type formed in the body region and having a higher average doping concentration than the body region; a source region of a first conductivity type opposite the second conductivity type formed in the body region adjacent the body contact region; a drift zone of the first conductivity type spaced apart from the source region by a section of the body region which forms a channel region of the semiconductor device; and a gate electrode configured to control the channel region. The body contact region extends under a majority of the source region in a direction towards the channel region and has a doping concentration of at least 1e18 cm$^{-3}$ under the majority of the source region.

The body contact region may extend under the entire source region and have a doping concentration of at least 1e18 cm$^{-3}$ under the entire source region.

Separately or in combination, the body contact region may have a doping concentration of at least 1e19 cm$^{-3}$ under the majority of the source region.

Separately or in combination, the body contact region may have a doping concentration of at least 2e19 cm$^{-3}$ under the majority of the source region.

Separately or in combination, the source region may have an average thickness over the majority of the source region and the thickness of the source region may increase 2× or more from the average thickness at a side of the source region adjacent to the channel region.

Separately or in combination, the source region may have an average thickness of less than 100 nm over the majority of the source region.

Separately or in combination, the average thickness of the source region may be between 40 nm and 80 nm over the majority of the source region.

Separately or in combination, the thickness of the source region may increase to at least 100 nm at a side of the source region adjacent to the channel region.

Separately or in combination, the thickness of the source region may increase to at least 120 nm at a side of the source region adjacent to the channel region.

Separately or in combination, the body region, the body contact region, the source region and the drift zone may be formed in an epitaxial layer, the source region may have a dopant concentration tail adjacent the channel region and which extends deeper into the epitaxial layer than the remainder of the source region, and the body contact region may extend under the source region at least to the dopant concentration tail of the source region.

Separately or in combination, the semiconductor device may be a lateral power semiconductor device, the body region, the body contact region, the source region and the drift zone may be formed in an epitaxial layer, the epitaxial layer may be formed over a semiconductor substrate, the epitaxial layer may be vertically separated from the semiconductor substrate by one or more isolation layers, a drain region of the first conductivity type may be formed in the epitaxial layer on an opposite side of the drift zone as the channel region, and the gate electrode may be disposed over the epitaxial layer and electrically insulated from the channel region.

Separately or in combination, a parasitic bipolar device formed by the source region, the body region and the drift zone may have a trigger voltage above which the parasitic bipolar device is triggered and begins to conduct current and a holding voltage above which the parasitic bipolar device continues to conduct current after being triggered, and a carrier ejection capacity of the source region may be such that the holding voltage of the parasitic bipolar device is above a supply voltage of the semiconductor device.

According to an embodiment of a method of manufacturing a semiconductor device, the method comprises: forming a body region of a second conductivity type; forming a body contact region of the second conductivity type in the body region, the body contact region having a higher average doping concentration than the body region; forming a source region of a first conductivity type opposite the second conductivity type in the body region adjacent the body contact region; forming a drift zone of the first conductivity type, the drift zone being spaced apart from the source region by a section of the body region which forms a channel region of the semiconductor device; and forming a gate electrode configured to control the channel region, wherein forming the body contact region includes extending the body contact region under a majority of the source region in a direction towards the channel region, the body contact region having a doping concentration of at least 1e18 cm$^{-3}$ under the majority of the source region.

Forming the body contact region and forming the source region may comprise: implanting dopant species of the first conductivity type into an epitaxial layer using a first mask with an opening that defines a source implant region in the epitaxial layer; implanting dopant species of the second conductivity type into the epitaxial layer using a second mask with an opening that defines a body contact implant region in the epitaxial layer, the opening in the second mask overlapping with the opening in the first mask so that the body contact implant region in the epitaxial layer overlaps with the source implant region in the epitaxial layer; and annealing the epitaxial layer to activate the implanted dopant species of the first and second conductivity types, and to diffuse the implanted dopant species of the second conductivity type under the majority of the source region in the direction towards the channel region at a doping concentration of at least 1e18 $cm^{-3}$ under the majority of the source region.

Separately or in combination, the opening in the second mask may overlap with the opening in the first mask by at least 50 nm.

Separately or in combination, the opening in the second mask may overlap with the opening in the first mask by at least 100 nm.

Separately or in combination, the dopant species of the first conductivity type may comprise phosphorous implanted into the epitaxial layer using the first mask at a dose of about 1 to 5e15 $cm^{-2}$ and energy of about 12 to 15 keV.

Separately or in combination, the dopant species of the second conductivity type may comprise boron and $BF_2$, the boron may be implanted into the epitaxial layer using the second mask at a dose of about 1 to 4e15 $cm^{-2}$ and energy of about 7 to 10 keV, and the $BF_2$ may be implanted into the epitaxial layer using the second mask at a dose of about 1 to 5e14 $cm^{-2}$ and energy of about 20 to 30 keV.

Separately or in combination, forming the body contact region and forming the source region may comprise: implanting dopant species of the first conductivity type and implanting dopant species of the second conductivity type into overlapping implantation regions of an epitaxial layer; and annealing the epitaxial layer to activate the implanted dopant species of the first and second conductivity types, to form a dopant concentration tail of the source region which is adjacent the channel region and extends deeper into the epitaxial layer than the remainder of the source region, and to extend the body contact region under the source region to at least the dopant concentration tail of the source region.

Separately or in combination, the semiconductor device may be a lateral power semiconductor device and the method may further comprise: forming an epitaxial layer over a semiconductor substrate; the epitaxial layer being vertically separated from the semiconductor substrate by one or more isolation layers; forming the body region, the body contact region, the source region and the drift zone are formed in the epitaxial layer; forming a drain region of the first conductivity type in the epitaxial layer on an opposite side of the drift zone as the channel region; and disposing the gate electrode over the epitaxial layer and electrically insulated from the channel region.

According to another embodiment of a semiconductor device, the semiconductor device comprises: a p-type body region; a p-type body contact region formed in the body region and having a higher average doping concentration than the body region; an n-type source region formed in the body region adjacent the body contact region; an n-type drift zone spaced apart from the source region by a section of the body region which forms a channel region of the semiconductor device; and a gate electrode configured to control the channel region. The body contact region extends under a majority of the source region in a direction towards the channel region. An npn parasitic bipolar device formed by the source region; the body region and the drift zone has a trigger voltage above which the parasitic bipolar device is triggered and begins to conduct current and a holding voltage above which the parasitic bipolar device continues to conduct current after being triggered. The source region is configured to have an electron ejection capacity such that the holding voltage of the parasitic bipolar device is above a supply voltage of the semiconductor device.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a semiconductor device with latchup immunity. The semiconductor device includes a parasitic bipolar device, e.g., an npn parasitic bipolar device in the case of an n-channel device. The parasitic bipolar device is formed by the source region, the body region and the drift zone of the semiconductor device. The parasitic bipolar device has a trigger voltage above which the parasitic bipolar device is triggered and begins to conduct current and a holding voltage above which the parasitic bipolar device continues to conduct current after being triggered. The parasitic bipolar device may be triggered, e.g., by a current spike event where excessive current is extracted out of a node of the semiconductor device, or an ESD event where an excessive voltage is applied to the drain or source terminal of the semiconductor device. Once triggered, the parasitic bipolar device will continue to conduct increasingly higher current if the holding voltage of the parasitic bipolar device is below the supply voltage of the semiconductor device. Such uncontrolled current flow will eventually destroy the semiconductor device, unless mitigated. To this end, the source region and the body contact region of the semiconductor device are configured such that the carrier ejection capacity of the source region is reduced to a level where the holding voltage of the parasitic bipolar device is set above the supply voltage of the semiconductor device. This way, the parasitic bipolar device turns off once the drain voltage of the semiconductor device snaps back to the holding voltage, without requiring complex ESD protection circuitry and implementation.

Figure 1:
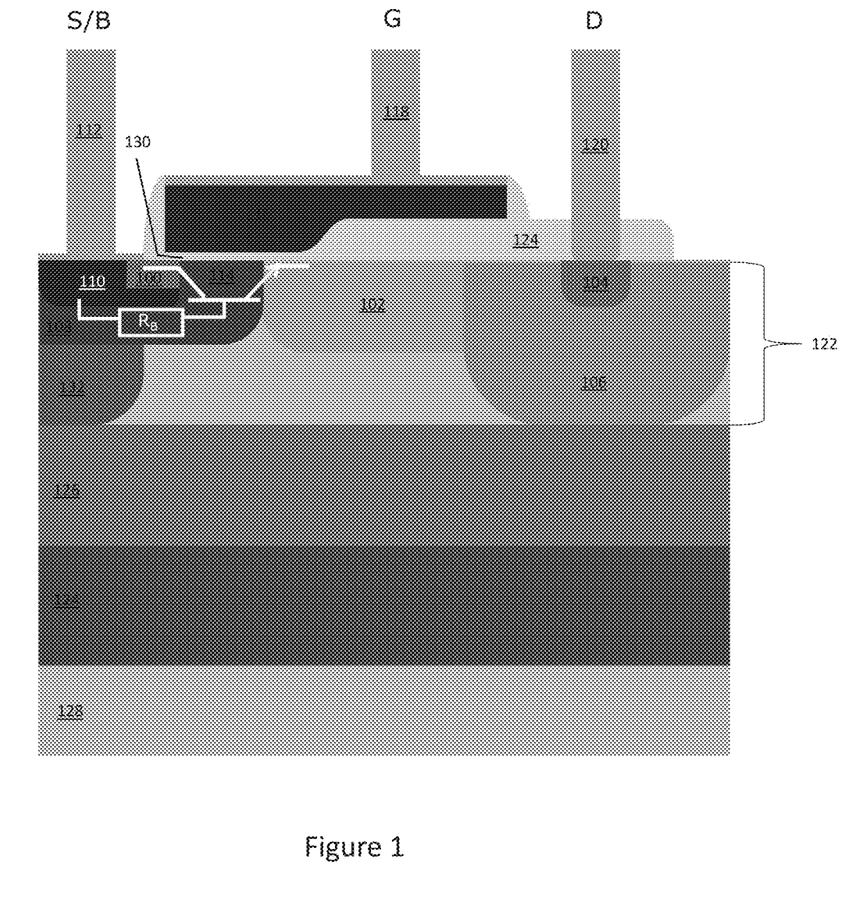
FIG. 1 illustrates a partial cross-sectional view of a semiconductor device with latchup immunity.

FIG. 1 illustrates a partial cross-sectional view of a semiconductor device with latchup immunity. The semiconductor device includes a source (emitter) region 100 of a first conductivity type, a drift zone 102 of the first conductivity type, a drain (collector) region 104 of a first conductivity type formed in a well 106 of the first conductivity type, a body region 108 of a second conductivity type opposite the first conductivity type, and a body contact region 110 of the second conductivity type. In the case of an n-channel device, the source region 100, drift zone 102 and drain region 104 are n-type and the body region 108 and body contact region 110 are p-type. In the case of a p-channel device, the source region 100, drift zone 102 and drain region 104 are p-type and the body region 108 and body contact region 110 are n-type.

The terms "source" and "emitter" are used interchangeably herein as are the terms "drain" and "collector", to indicate that the semiconductor device may be a MOSFET (metal-oxide-semiconductor field-effect transistor), HEMT (high-electron mobility transistor), IGBT (insulated gate bipolar transistor) or similar device. The semiconductor device may be the device requiring protection from current spikes and ESD events. For example, the semiconductor device may be a discrete power transistor die or a transistor monolithically integrated with one or more additional transistors and/or other devices in the same semiconductor die. The semiconductor device may instead form part of an ESD protection circuit.

The semiconductor device is illustrated as a lateral DMOS (LDMOS) device in FIG. 1, where the primary direction of current flow between the source and drain regions 100, 104 is lateral (i.e. parallel to the top main surface of the device). The semiconductor device may instead be a vertical device where the gate structure is formed in a trench and the primary direction of current flow between the source and drain regions 100, 104 is vertical (i.e. perpendicular to the top main surface of the device).

In either case, the body contact region 110 is formed in the body region 108 and has a higher average doping concentration than the body region 108 so as to provide an ohmic connection between the body region 108 and a source/body (S/B) electrode 112 of the semiconductor device. The source region 100 is formed in the body region 108 adjacent the body contact region 110 and also is in ohmic contact with the source/body (S/B) electrode 112. The drift zone 102 is spaced apart from the source region 100 by a section of the body region 108 which forms a channel region 114 of the semiconductor device. The channel region 114 is controlled by a gate electrode 116 which is connected to a gate (G) metallization 118. The drain region 104 is in ohmic contact with a drain (D) electrode 120 of the device. The source and drain electrodes 112, 120 and the gate metallization 118 may be realized in one or more metal layers disposed above an epitaxial layer 122 in which the device regions are formed and connected to the respective device regions through openings in an interlayer dielectric 124.

According to the LDMOS embodiment illustrated in FIG. 1, the semiconductor device is a lateral power semiconductor device. The body region 108, the body contact region 110, the source region 100, the drift zone 102 and the drain region 104 are formed in an epitaxial layer 122 and the epitaxial layer 122 is formed over a semiconductor substrate (not shown for ease of illustration). The epitaxial layer 122 and the semiconductor substrate may comprise Si or a compound semiconductor such as SiC, GaN, SiGe, AlGaAs, etc. The epitaxial layer 122 is vertically separated from the semiconductor substrate by one or more isolation layers 124, 126. A buried layer 128 may be provided below the isolation layer(s) 124, 126 for providing lateral connections and/or forming devices at the backside of the device. The drain region 104 is formed in the epitaxial layer 122 on a side of the drift zone 102 opposite the channel region 114, and the gate electrode 116 is disposed over the epitaxial layer 122 and electrically insulated from the channel region 114 by a gate dielectric 130 such as silicon oxide. A deep doped region 132 of the second conductivity type may extend deeper into the epitaxial layer 122 than the body region 108 on the source-side of the device. In the case of a vertical device, the drain region 104 would be formed at the opposite side of the semiconductor device as the source region 100. In the case of an IGBT, the drain region 104 would be replaced by a region of the opposite conductivity type.

For each type of semiconductor device (lateral, vertical, MOSFET, HEMT, IGBT, etc.), the body contact region 110 extends under a majority (i.e. more than 50%) of the source region 100 in a direction towards the channel region 114. A parasitic bipolar device formed by the source region 100, the body region 108 and the drift zone 102 is shown as a schematic overlay in FIG. 1. The parasitic bipolar device is an npn device in the case of an n-channel semiconductor device, and a pnp device in the case of a p-channel semiconductor device. In either case, the parasitic bipolar device has a trigger voltage (Vt) above which the parasitic bipolar device is triggered and begins to conduct current and a holding voltage (Vh) above which the parasitic bipolar device continues to conduct current after being triggered. As previously explained herein, the parasitic bipolar device may be triggered by a current spike event, an ESD event, etc. Once triggered, the parasitic bipolar device will continue to conduct increasingly higher current if the holding voltage is below the supply voltage of the semiconductor device. However, the source region 100 and the body contact region 110 are configured such that the carrier ejection capacity of the source region 100 is reduced to a level that ensures the holding voltage of the parasitic bipolar device is above the supply voltage of the semiconductor device. Accordingly, the parasitic bipolar device turns off (after being triggered) when the drain voltage of the semiconductor device snaps back to the holding voltage. The carrier ejection capacity of the source region 100 is the total amount of electrons (for an n-channel device) or holes (for a p-channel device) capable of being ejected from the source region 100 into the base of the parasitic bipolar device during a triggering event.

Figure 2:
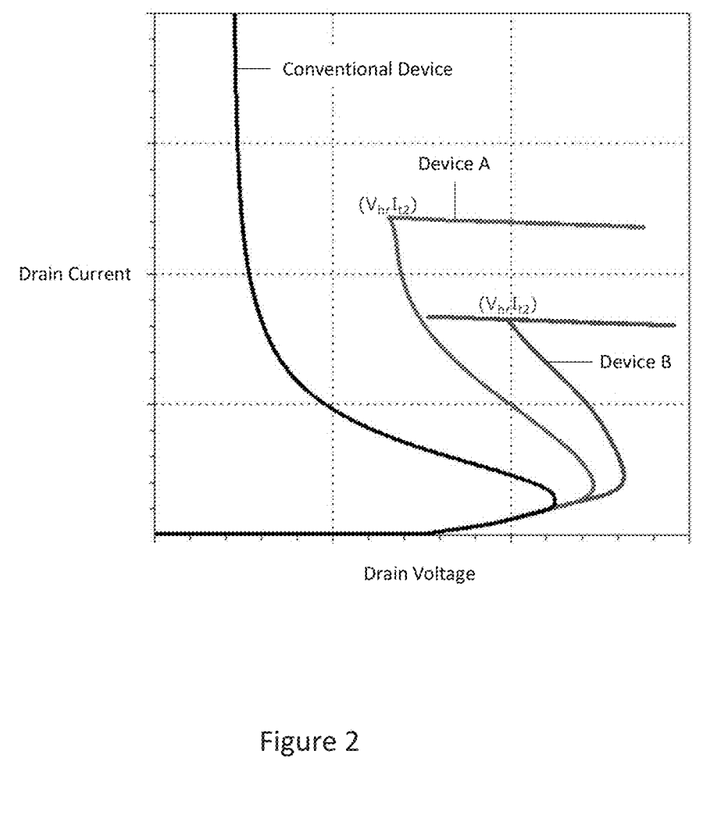
FIG. 2 illustrates a plots diagram of drain current as a function of drain voltage for three different semiconductor devices shown in FIGS. 3A through 3B.
Figure 3A:
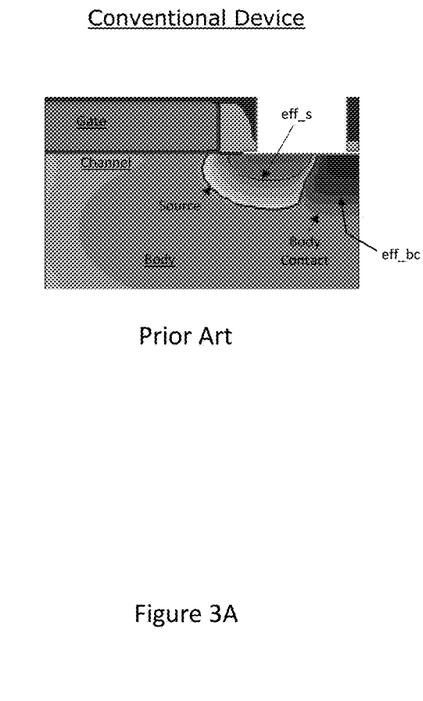
FIG. 3A illustrates a partial cross-sectional view of a conventional semiconductor device having a typical source region and body contact region configuration.
Figure 3B:
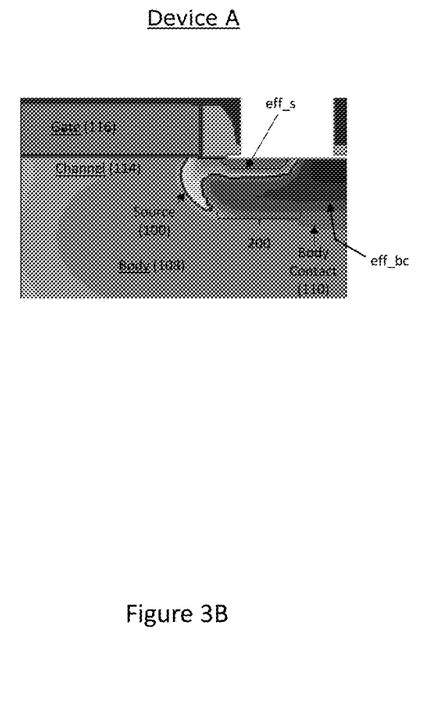
FIG. 3B illustrates a partial cross-sectional view of a semiconductor device having a source region configured with a reduced carrier ejection capacity.
Figure 3C:
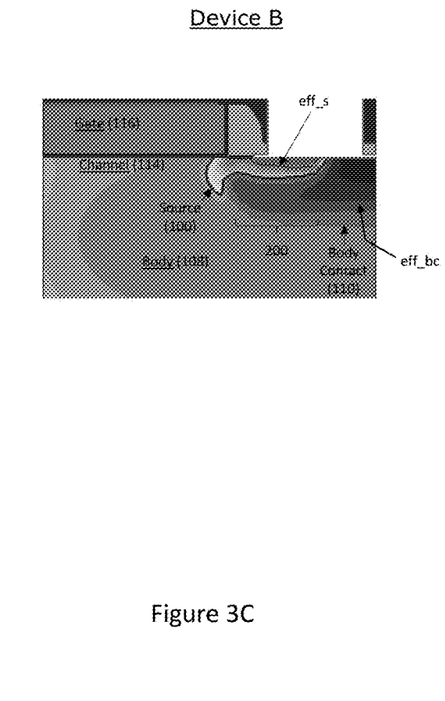
FIG. 3C illustrates a partial cross-sectional view of a semiconductor device having a source region configured to have a carrier ejection capacity lower than the carrier ejection capacity of the semiconductor device shown in FIG. 3B.

FIG. 2 plots drain current as a function of drain voltage for the three different semiconductor devices shown in FIGS. 3A through 3C. The curve labelled 'Conventional Device' in FIG. 2 corresponds to the conventional semiconductor device shown in FIG. 3A which has a typical source region and body contact region configuration. The curve labelled 'Device A' in FIG. 2 corresponds to semiconductor device A shown in FIG. 3B and which has a source region configured with a reduced carrier ejection capacity in accordance with the embodiments described herein. The curve labelled 'Device B' in FIG. 2 corresponds to second semiconductor device B shown in FIG. 30 and which has a source region configured to have a carrier ejection capacity lower than the carrier ejection capacity of the semiconductor device A shown in FIG. 3B.

Semiconductor device A shown in FIG. 3B has a higher trigger (breakdown) point than the conventional device shown in FIG. 3A, and semiconductor device B shown in FIG. 3C has a higher trigger point than semiconductor device A shown in FIG. 3B. The trigger points are labelled "Vt1, It1" for each device to indicate the breakdown voltage ("Vt1") and drain current ("It1") at which the parasitic bipolar device included in the respective devices is triggered and begins to conduct current. The semiconductor devices shown in FIGS. 3B and 3C have a body contact extension 200 under the source region (labelled 'Source' in FIGS. 3A through 3C) which provides a low connection resistance, labelled $R_B$ in FIG. 1, to the base of the parasitic bipolar device which leads to the higher trigger point. Shortly after a triggering event, the drain voltage of each device abruptly snaps back as the drain current continues to rise. The drain voltage eventually drops to the holding voltage (Vh) of the respective parasitic bipolar device.

If the holding voltage is below the supply voltage of the semiconductor device, the drain current will continue to rise until the device is destroyed. In FIG. 2, the holding voltage of the conventional semiconductor device shown in FIG. 3A is below the supply voltage of the device. Accordingly, the drain current continues to rise unabated. However, semiconductor device A shown in FIG. 3B has a source region with reduced carrier ejection capacity and a holding voltage above the supply voltage. Accordingly, the drain current of semiconductor device A stops when the holding voltage is reached and the parasitic bipolar device turns off. The holding voltage of semiconductor device B shown in FIG. 3O is even higher than the holding voltage of semiconductor device A shown in FIG. 3B, and therefore the parasitic bipolar device in semiconductor device B turns off quicker. Current $I_{t2}$ in FIG. 2 is the destruction current for semiconductor devices A and B. The line labelled "eff_s" in FIGS. 3A through 3C indicates an exemplary n-doping concentration of about 1e20 $cm^{-3}$, and the line labelled "eff_bc" in FIGS. 3A through 3C indicates an exemplary p-doping concentration of about 2e19 $cm^{-3}$. The device examples shown in FIGS. 3A through 3C are n-channel devices where the source region is n-type and the body contact region is p-type.

The holding voltage for a parasitic bipolar device in a semiconductor device is affected by several parameters, including base resistance, the carrier ejection capacity of the source region, etc. According to the embodiments described herein, the source region 100 and body contact region 110 of the semiconductor device are configured such that the carrier ejection capacity of the source region 100 is reduced to a level where the holding voltage of the parasitic bipolar device is set above the supply voltage of the semiconductor device. In an embodiment, the body contact region 110 extends under the majority of the source region 100 in a direction towards the channel region 114 and has a doping concentration of at least 1e18 $cm^{-3}$, or at least 1e19 $cm^{-3}$, or at least 2e19 $cm^{-3}$ under the majority of the source region 100 so as to reduce the carrier ejection capacity of the source region 100 to a level where the holding voltage of the parasitic bipolar device is set above the supply voltage of the semiconductor device. In another embodiment, the body contact region 110 extends under the entire source region 100 and has a doping concentration of at least 1e18 $cm^{-3}$ under the entire source region 100 so as to reduce the carrier ejection capacity of the source region 100 to a level where the holding voltage of the parasitic bipolar device is set above the supply voltage of the semiconductor device.

Separately or in combination, the source region 100 may be relatively thin compared to the source region of a typical semiconductor device so as to reduce the carrier ejection capacity of the source region 100 to a level where the holding voltage of the parasitic bipolar device is set above the supply voltage of the semiconductor device. For example, the source region 100 may have an average thickness of less than 100 nm over the majority of the source region 100.

Figure 4A:
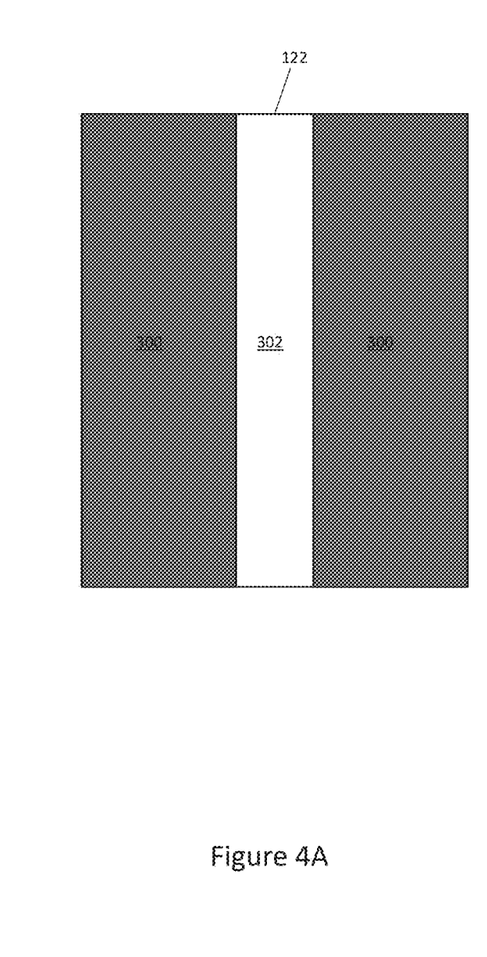
FIGS. 4A, 4B, 5A and 5B illustrate an embodiment of a method of forming the source and body contact regions of the semiconductor device shown in FIG. 1.
Figure 4B:
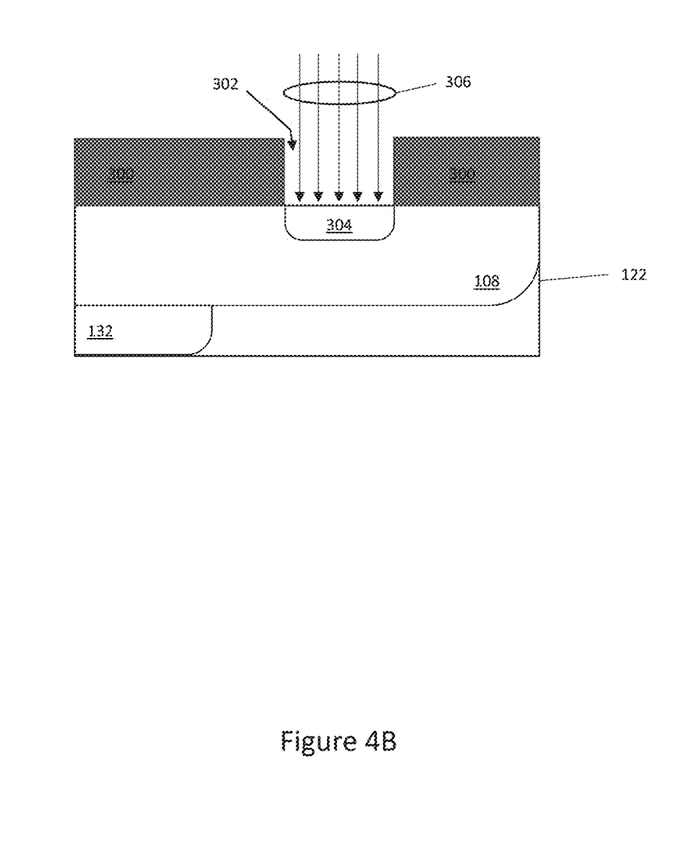
Figure 5A:
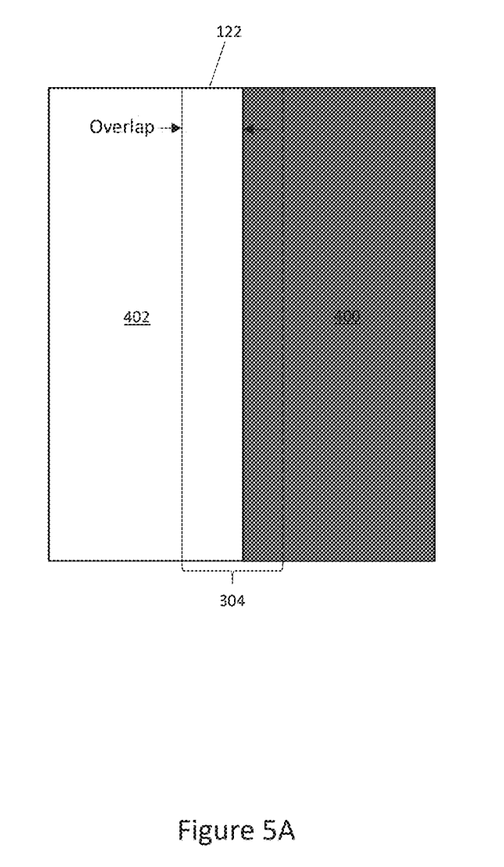
Figure 5B:
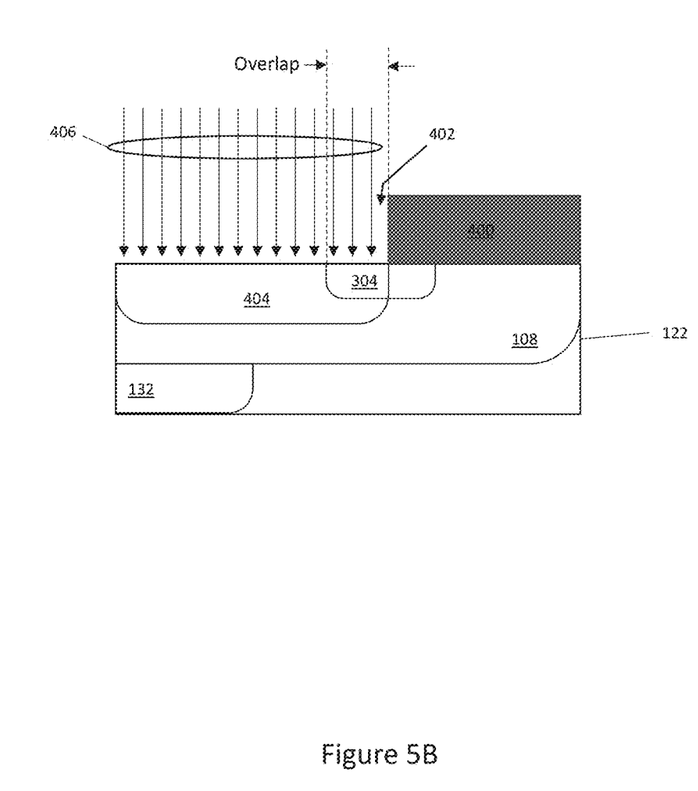

FIGS. 4A through 5B illustrate an embodiment of a method of forming the source region 100 and the body contact region 110 of the semiconductor device shown in FIG. 1. FIGS. 4A and 5A are partial top-down plan views which focus on the region of the device with the source region 100 and the body contact region 110, whereas FIGS. 4B and 5B are corresponding partial cross-sectional views.

FIGS. 4A and 4B show the semiconductor device after the epitaxial layer 122 is formed over the semiconductor substrate and the base region 108 is formed in the epitaxial layer 122. Any standard epitaxy and doping processes may be used to form the epitaxial layer 122 and the base region 108. FIGS. 4A and 4B also show a first blocking mask 300 such as a photoresist, oxide, polysilicon, metal, etc. formed on the epitaxial layer 122. The first blocking mask 300 has an opening 302 which defines a source implant region 304 in the epitaxial layer 122.

FIG. 4B shows the semiconductor device during implanting dopant species 306 of the first conductivity type through the opening 302 in the first blocking mask 300 and into the source implant region 304 of the epitaxial layer 122. In one embodiment, the dopant species 306 of the first conductivity type comprises phosphorous which is implanted into the source implant region 304 of epitaxial layer 122 through the opening 302 in the first blocking mask at a dose of about 1 to 5e15 $cm^{-2}$ and energy of about 12 to 15 keV.

FIGS. 5A and 5B show the semiconductor device during a subsequent implantation process to form the body contact region 110. The first blocking mask 300 is removed after the source implantation process, and a second blocking mask 400 such as a photoresist, oxide, polysilicon, metal, etc. is formed on the epitaxial layer 122. The second blocking mask 400 has an opening 402 which defines a body contact implant region 404 in the epitaxial layer 122. The opening 402 in the second blocking mask 400 overlaps with the opening 302 in the first blocking mask 300 so that the body contact implant region 404 in the epitaxial layer 122 overlaps with the source implant region 304 in the epitaxial layer 122. The opening 402 in the second blocking mask 400 may overlap with the opening 302 in the first blocking mask 300 by at least 50 nm, by at least 100 nm, etc. The overlap between the edge of the second blocking mask 400 and the corresponding edge of the source implant region 304 is labelled 'Overlap' in FIGS. 5A and 5B.

FIG. 5B shows the semiconductor device during implanting dopant species 406 of the second conductivity type through the opening 402 in the second blocking mask 400 and into the body contact implant region 404 of the epitaxial layer 122. In one embodiment, the dopant species 406 of the second conductivity type comprises boron and $BF_2$, the boron is implanted into the body contact implant region 404 of the epitaxial layer through the opening 402 in the second mask 400 at a dose of about 1 to 4e15 $cm^{-2}$ and energy of about 7 to 10 keV, and the $BF_2$ is implanted into the body contact implant region 404 of the epitaxial layer through the opening 402 of the second mask 400 at a dose of about 1 to 5e14 cm$^{-2}$ and energy of about 20 to 30 keV.

The epitaxial layer 122 is subsequently annealed to activate the implanted dopant species 306, 406 of the first and second conductivity types and form the source and body contact regions 100, 110, respectively. In one embodiment, the epitaxial layer 122 is annealed for a few seconds at about 1000 to 1010° C. to activate both types of implanted dopant species 306, 406. Particularly in the case of Boron as the dopant species 406 of the second conductivity type and Si as the semiconductor material of the epitaxial layer 122, the implanted dopant species 406 of the second conductivity type readily diffuses under the majority of the source region 100 in the direction towards the channel region 114 and may have a doping concentration of at least 1e18 cm$^{-3}$ under the majority of the source region 100 for the B and BF$_2$ dose and energy implantation ranges given above. Other types of dopant species may diffuse under the majority of the source region 100 in the direction towards the channel region 114 and may have a doping concentration of at least 1e18 cm$^{-3}$ under the majority of the source region 100. The body contact region 110 may even extend under the entire source region 100 as shown in FIG. 1 and have a doping concentration of at least 1e18 cm$^{-3}$ under the entire source region 100. With the method illustrated in FIGS. 4A through 5B, the source doping profile is modified via implantation masks 400, 500 having overlap which results in modulation of the ejected carrier capacity from the source side without any further process adaptation.

Figure 6A:
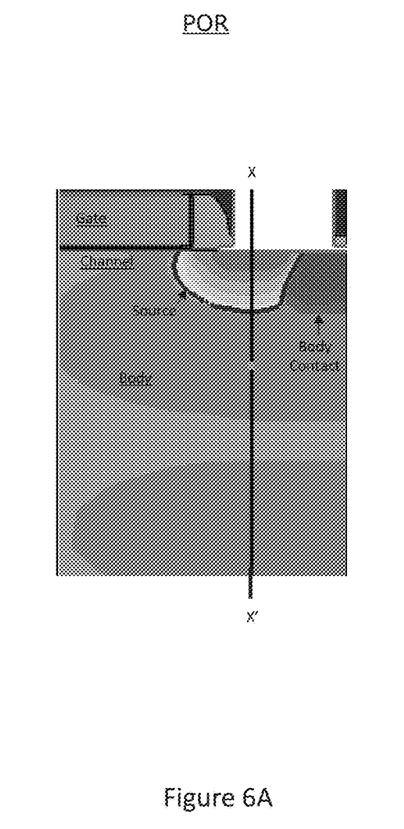
FIG. 6A illustrates a cross-sectional view of source and body contact regions of a conventional semiconductor device which are produced by conventional source and body contact implantation techniques.
Figure 6B:
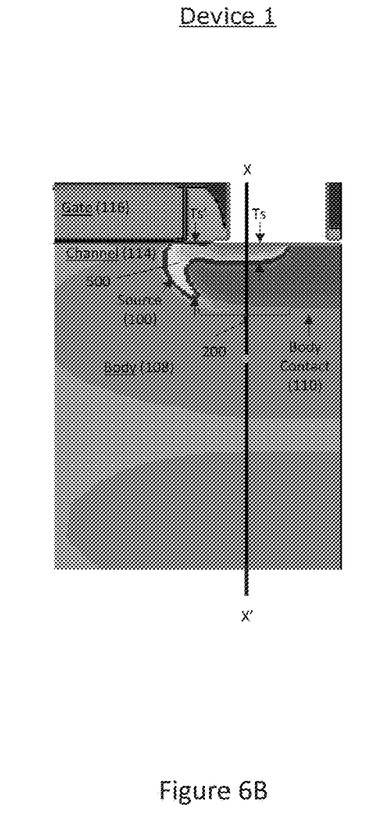
FIG. 6B illustrates a cross-sectional view of source and body contact regions of a semiconductor device which are produced by the implantation method illustrated in FIGS. 4A through 5B.

FIG. 6A illustrates a cross-sectional view of the source region and the body contact region of a conventional semiconductor device (FOR) and which are produced by conventional source and body contact implantation techniques whereby the opening in the blocking mask used for implanting the body contact region does not overlap with the opening in the blocking mask used for implanting the source region. Hence, the resulting body contact region has little to no extension under the source region as shown in FIG. 6A. FIG. 6B illustrates a cross-sectional view of the source region and the body contact region of a semiconductor device (Device 1) and which are produced by the implantation method illustrated in FIGS. 4A through 5B.

Figure 6C:
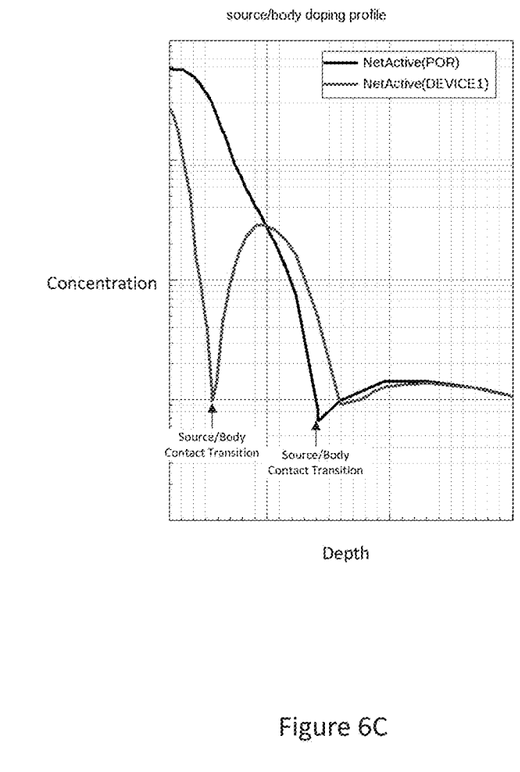
FIG. 6C illustrates a plot diagram comparing doping concentrations of the semiconductor devices along the line labelled C1 in FIGS. 6A and 6B.

Contrary to the conventional device shown in FIG. 6A, the body contact region 110 of the semiconductor device in FIG. 6B extends under a majority of the source region 100 in a direction towards the channel region 114 and has a doping concentration of at least 1e18 cm$^{-3}$ under the majority of the source region 100. FIG. 6C compares the doping concentrations of the two semiconductor devices along the line labelled X-X' in FIGS. 6A and 6B. The semiconductor device in FIG. 6B has a significantly thinner source region 100 than the conventional device shown in FIG. 6A as indicated by the doping inflection points labelled "Source/Body Contact Transition" in FIG. 6C. The shallower source region 100 leads to a shallow area, e.g., about 100 nm for current flow in the parasitic bipolar device during injection mode without termination via the body contact region 110, effectively increasing the base resistance of the parasitic bipolar device.

In one embodiment, the average thickness (Ts) of the source region 100 is between 40 nm and 80 nm over the majority of the source region 100. The thickness of the source region 100 may increase 2× or more from the average thickness at a side of the source region 100 adjacent to the channel region 114. For example, the source region 100 may have a dopant concentration tail 500 adjacent the channel region 114 and which extends deeper into the epitaxial layer 122 than the remainder of the source region 100.

The body contact region 110 may extend under the source region 100 at least to the dopant concentration tail 500 of the source region 100. The source dopant concentration tail 500 and the body contact region extension 200 may be realized by using the implantation method illustrated in FIGS. 4A through 5B, with Phosphorous as the source dopant species 306 and Boron as the body contact region dopant species 406. For example, phosphorous atoms and boron atoms may be implanted into overlapping implantation regions 304, 404 of the epitaxial layer 122 and the epitaxial layer 122 may be annealed to activate the implanted phosphorous atoms and boron atoms to form the source and body contact regions 100, 110, respectively. By forming a shallower than typical source region 100 and using a dopant species with high diffusivity such as Boron to form the body contact region 110, the source region 100 may be formed with a dopant concentration tail 500 which is adjacent the channel region 114 and extends deeper to the epitaxial layer 122 than the remainder of the source region 100, and the body contact region 110 may extend under the source region 100 to at least the dopant concentration tail 500 of the source region 100. In an embodiment, the source region 100 may have a thickness Ts' of at least 100 nm or at least 120 nm at the side of the source region 100 adjacent to the channel region 114, i.e., in the dopant concentration tail 500, for a source region 100 having an average thickness Ts between 40 nm and 80 nm over the majority of the source region 100 outside the dopant concentration tail 500.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor body comprising a main surface;
    a body region of a second conductivity type;
    a body contact region of the second conductivity type formed in the body region and having a higher average doping concentration than the body region; a source region of a first conductivity type opposite to the second conductivity type formed in the body region adjacent to the body contact region; a drift zone of the first conductivity type spaced apart from the source region by a section of the body region which forms a channel region of the semiconductor device; and a gate electrode configured to control the channel region;
wherein the body contact region extends under a majority of the source region in a direction towards the channel region and has a doping concentration of at least 1e18 cm$^{-3}$ under the majority of the source region,
wherein the source region has an average thickness over the majority of the source region, and
wherein the thickness of the source region increases 2× or more from the average thickness at a side of the source region adjacent to the channel region,
the average thickness being measured in a vertical direction that is perpendicular to the main surface,
wherein an upper surface of the source region and an upper surface of the body contact region each extend along a single plane that is coplanar with the main surface of the semiconductor body;
wherein the average thickness of the source region is less than 100 nm over the majority of the source region and the average thickness of the source region increases to at least 100 nm at a side of the source region adjacent to the channel region.

2. The semiconductor device of claim 1, wherein the body contact region extends under the entire source region and has a doping concentration of at least 1e18 cm$^{-3}$ under the entire source region.

3. The semiconductor device of claim 1, wherein the body contact region has a doping concentration of at least 1e19 cm$^{-3}$ under the majority of the source region.

4. The semiconductor device of claim 1, wherein the body contact region has a doping concentration of at least 2e19 cm$^{-3}$ under the majority of the source region.

5. The semiconductor device of claim 1, wherein the average thickness of the source region is between 40 nm and 80 nm over the majority of the source region.

6. The semiconductor device of claim 1, wherein the thickness of the source region increases to at least 120 nm at a side of the source region adjacent to the channel region.

7. The semiconductor device of claim 1, wherein the body region, the body contact region, the source region and the drift zone are formed in an epitaxial layer, wherein the source region has a dopant concentration tail that is adjacent to the channel region and which extends deeper into the epitaxial layer than the remainder of the source region, and wherein the body contact region extends under the source region at least to the dopant concentration tail of the source region.

8. The semiconductor device of claim 1, wherein the semiconductor device is a lateral power semiconductor device, wherein the body region, the body contact region, the source region and the drift zone are formed in an epitaxial layer, wherein the epitaxial layer is formed over a semiconductor substrate, wherein the epitaxial layer is vertically separated from the semiconductor substrate by one or more isolation layers, wherein a drain region of the first conductivity type is formed in the epitaxial layer on an opposite side of the drift zone as the channel region, and wherein the gate electrode is disposed over the epitaxial layer and electrically insulated from the channel region.

9. The semiconductor device of claim 1, wherein a parasitic bipolar device formed by the source region, the body region and the drift zone has a trigger voltage above which the parasitic bipolar device is triggered and begins to conduct current and a holding voltage above which the parasitic bipolar device continues to conduct current after being triggered, and wherein a carrier ejection capacity of the source region is such that the holding voltage of the parasitic bipolar device is above a supply voltage of the semiconductor device.

10. A semiconductor device, comprising:
a semiconductor body comprising a main surface;
a p-type body region;
a p-type body contact region formed in the body region and having a higher average doping concentration than the body region;
an n-type source region formed in the body region adjacent to the body contact region;
an n-type drift zone spaced apart from the source region by a section of the body region which forms a channel region of the semiconductor device; and
a gate electrode configured to control the channel region;
wherein the body contact region extends under a majority of the source region in a direction towards the channel region,
wherein an npn parasitic bipolar device formed by the source region, the body region and the drift zone has a trigger voltage above which the parasitic bipolar device is triggered and begins to conduct current and a holding voltage above which the parasitic bipolar device continues to conduct current after being triggered,
wherein the source region is configured to have an electron ejection capacity such that the holding voltage of the parasitic bipolar device is above a supply voltage of the semiconductor device;
wherein the source region has an average thickness over the majority of the source region, the average thickness being measured in a vertical direction that is perpendicular to the main surface;
wherein the average thickness of the source region is less than 100 nm over the majority of the source region and the average thickness of the source region increases to at least 100 nm at a side of the source region adjacent to the channel region.

11. A semiconductor device, comprising:
a semiconductor body comprising a main surface;
a body region of a second conductivity type;
a body contact region of the second conductivity type formed in the body region and having a higher average doping concentration than the body region;
a source region of a first conductivity type opposite to the second conductivity type formed in the body region adjacent to the body contact region;
a drift zone of the first conductivity type spaced apart from the source region by a section of the body region which forms a channel region of the semiconductor device; and
a gate electrode configured to control the channel region;
wherein the body contact region extends under a majority of the source region in a direction towards the channel region and has a doping concentration of at least 1e18 cm$^{-3}$ under the majority of the source region, wherein the source region has an average thickness of less than 100 nm over the majority of the source region, the average thickness being measured in a vertical direction that is perpendicular to the main surface;
wherein the average thickness of the source region increases to at least 100 nm at a side of the source region adjacent to the channel region.

12. The semiconductor device of claim 1, wherein the gate electrode is disposed on a portion of the main surface that is coplanar with the upper surface of the source region.

13. The semiconductor device of claim 1, wherein the source region extends deeper into the semiconductor body at the side of the source region adjacent to the channel region than in the majority of the source region.

* * * * *